(12) United States Patent
Ghariehali

(10) Patent No.: US 11,635,684 B1
(45) Date of Patent: Apr. 25, 2023

(54) APPARATUS FOR IMPRINT LITHOGRAPHY CONFIGURED TO GENERATE A FLUID DROPLET PATTERN AND A METHOD OF USING SUCH APPARATUS

(71) Applicant: CANON KABUSHIKI KAISHA, Tokyo (JP)

(72) Inventor: Amir Tavakkoli Kermani Ghariehali, Albany, NY (US)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/657,308

(22) Filed: Mar. 30, 2022

(51) Int. Cl.
*G03F 7/00* (2006.01)

(52) U.S. Cl.
CPC ........... *G03F 7/0002* (2013.01); *Y10S 977/84* (2013.01)

(58) Field of Classification Search
CPC ....................................................... G03F 7/002
See application file for complete search history.

(56) References Cited

U.S. PATENT DOCUMENTS

| | | | |
|---|---|---|---|
| 6,873,087 B1 | 3/2005 | Choi et al. | |
| 9,360,751 B2 | 6/2016 | Yang et al. | |
| 10,468,247 B2 | 11/2019 | Fletcher et al. | |
| 10,481,491 B2 | 11/2019 | Fletcher et al. | |
| 10,634,993 B2 | 4/2020 | Fletcher | |
| 2010/0124601 A1 | 5/2010 | Ota et al. | |
| 2015/0017329 A1* | 1/2015 | Fletcher | G03F 7/0002 427/277 |
| 2018/0162014 A1* | 6/2018 | Fletcher | G03F 7/0002 |
| 2019/0139789 A1* | 5/2019 | Tavakkoli Kermani Ghariehali | B41J 2/005 |
| 2020/0341368 A1 | 10/2020 | Yamashita | |
| 2022/0091500 A1* | 3/2022 | Tavakkoli Kermani Ghariehali | G03F 7/0002 |
| 2022/0128907 A1 | 4/2022 | Tavakkoli Kermani Ghariehali et al. | |

* cited by examiner

*Primary Examiner* — Joshua D Zimmerman
(74) *Attorney, Agent, or Firm* — Abel Schillinger, LLP

(57) ABSTRACT

An apparatus for imprint lithography can include a logic element configured to generate a fluid droplet pattern of fluid droplets of a formable material to be dispensed onto a substrate. The fluid droplet pattern includes an imprint field, wherein the imprint field has an edge and a drop edge exclusion along the edge. In another aspect, a method can be carried out using the apparatus. The apparatus and method can be useful in filling an imprint field with a formable material relatively quickly without extrusion defects or other complications. The method can include determining a fluid droplet pattern with a first row along the edge of the imprint field having a first linear density and a second row having a second linear density, where the first linear density, the amount of droplets in the first row, is different than a second linear density, amount of droplets within the second row.

20 Claims, 10 Drawing Sheets

APPARATUS FOR IMPRINT LITHOGRAPHY CONFIGURED TO GENERATE A FLUID DROPLET PATTERN AND A METHOD OF USING SUCH APPARATUS

FIELD OF THE DISCLOSURE

The present disclosure relates to apparatuses for imprint lithography, and more particularly to apparatuses including a logic element to generate a fluid droplet pattern.

RELATED ART

Fluid deposition techniques are useful in fabricating electronic devices on semiconductor wafers. Such techniques can include the use of fluid dispense systems for depositing a formable material, for example, a polymerizable material, such as a resist, onto the wafer, using techniques such as fluid droplet dispense. A template patterns the dispensed material before the dispensed material is solidified on the wafer to form a patterned layer on the wafer that can subsequently be used in fabricating semiconductor devices.

A patterned technique involves dispensing a variable drop pattern of polymerizable material between the substrate and a template, where the drop pattern varies depending on the substrate topography. Template feature fill rates and related defects are dependent, in part, on substrate and template pattern feature densities and orientations and the droplet pattern arrangement, including the fluid droplet pitch. Traditional fluid dispense systems permit some adjustment of inter-droplet spacing. However, they typically have constraints that limit the extent of such adjustments, and such adjustments may take a significant amount of time to form proper features. Thus, there continues to be an industry demand for droplet pattern generation processes that allow for uniform template feature fill rates, quicker times to form properly filled template patterns.

SUMMARY

In an embodiment, a method of generating a fluid drop pattern in imprint lithography is disclosed. The method can include determining the fluid droplet pattern of fluid droplets of a formable material to be dispensed in one or more rows onto a substrate, where the fluid droplet pattern can include a first row and a second row of an imprint field, where the first row is closer to an edge of the imprint field than the second row and where the first row is along the edge of the imprint field, where the first row has a first linear density determined by the amount of μm between droplets within the first row and the second row has a second linear density determined by the amount of μm between droplets within the second row, and where the first linear density is different from the second linear density; and dispensing fluid droplets of the formable material onto the substrate corresponding to the fluid droplet pattern.

In a particular embodiment, the method can further include a third row with a third linear density determined by the amount of μm between droplets within the third row, where the second row is closer to the edge than the third row, and where the second linear density is the same as the third linear density.

In a more particular embodiment, the first row, the second row, and the third row are along the X-direction.

In another embodiment, the first row can include one or more droplets, and where a first pitch between a first droplet of the one or more droplets and a second droplet of the one or more droplets is different from a second pitch between the second droplet of the one or more droplets and a third droplet of the one or more droplets.

In yet another embodiment, the second droplet is between the first droplet and the third droplet.

In a particular embodiment, the method can further include a fourth droplet, a fifth droplet, and a sixth droplet spaced apart from the first droplet, the second droplet, and the third droplet, where a third pitch between the fourth droplet and the fifth droplet is different from a fourth pitch between the fifth droplet and the sixth droplet.

In a more particular embodiment, the fourth pitch is different from the second pitch.

In another more particular embodiment, the first row can include one or more droplets, where each two droplets of the one or more droplets can include a pitch, and where at least one pitch is different from every other pitch within the first row.

In another embodiment, at least two pitches are different from every other pitch within the first row.

In yet another embodiment, the DEE of the one or more droplets in the first row is the same.

In a particular embodiment, the method can further include determining an initial fluid droplet pattern of fluid droplets of a formable material to be dispensed in one or more rows, including the first row and the second row, onto a substrate; adjusting the initial fluid droplet pattern to an intermediate fluid droplet pattern, where adjusting the initial fluid droplet pattern can include: determining a mean optimum DEE; and moving the fluid droplet pattern relative the imprint field by a distance corresponding to the mean optimum DEE; adjusting the intermediate fluid droplet pattern to an adjusted fluid droplet pattern, where the adjusted fluid droplet pattern can include the first linear density and the second linear density; and dispensing fluid droplets of the formable material onto the substrate corresponding to the adjusted fluid droplet pattern.

In another embodiment, a method of generating a fluid drop pattern in imprint lithography can be disclosed. The method can include determining an initial fluid droplet pattern of fluid droplets of a formable material to be dispensed in one or more rows onto a substrate, where the fluid droplet pattern includes an imprint field, and where the imprint field has an edge and a drop edge exclusion (DEE) along the edge. The method can also include adjusting the initial fluid droplet pattern to an intermediate fluid droplet pattern, where adjusting the initial fluid droplet pattern can include: determining a mean optimum DEE from two or more optimum DEEs, and moving the fluid droplet pattern relative the imprint field by a distance corresponding to the mean optimum DEE, adjusting the intermediate fluid droplet pattern to an adjusted fluid droplet pattern, where the adjusted fluid droplet pattern can include a linear density of a row along the edge that is different from the linear density of a row away from the edge, and dispensing fluid droplets of the formable material onto the substrate corresponding to the adjusted fluid droplet pattern.

In yet another embodiment, determining the two or more optimum DEEs can include calculating a first optimum DEE for a first zone of one or more droplets and a second optimum DEE for a second zone of one or more droplets, where the two or more optimum DEEs is a shortest distance between a terminal fluid droplet and its adjacent edge of the imprint field.

In a particular embodiment, adjusting the intermediate fluid droplet pattern can include determining a step configuration based on the mean optimum DEE and an optimum DEE for each zone.

In another particular embodiment, dispensing the fluid droplets of the formable material is performed during a single pass using a fluid dispenser having a series of nozzles that are aligned with the edge.

In yet another embodiment, the drop edge exclusion can be defined by the edge of the imprint field and a line passing through centers of fluid droplets that is closest to the edge.

In another embodiment, the adjusted fluid droplet pattern minimizes extrusion defects and non-fill defects.

In a particular embodiment, the first row can include three or more droplets, and where a distance along the first row between each two neighboring droplets of the three or more droplets can include a pitch, and where at least one pitch in the first row is different from every other pitch within the first row.

In another embodiment, at least two pitches are different from every other pitch within the first row and where the DEE of the one or more droplets in the first row is the same.

In yet another embodiment, a method of manufacturing an article using a method of generating a fluid drop pattern in imprint lithography is disclosed. The method of manufacturing the article can include determining an initial fluid droplet pattern of fluid droplets of a formable material to be dispensed in one or more rows onto a substrate, where the fluid droplet pattern includes an imprint field, and where the imprint field has an edge and a drop edge exclusion (DEE) along the edge. The method can also include adjusting the initial fluid droplet pattern to an intermediate fluid droplet pattern. Adjusting the initial fluid droplet pattern can include determining a mean optimum DEE from one or more optimum DEEs and moving the fluid droplet pattern relative the imprint field by a distance corresponding to the mean optimum DEE. The method of manufacturing an article can also include adjusting the intermediate fluid droplet pattern to an adjusted fluid droplet pattern, where the adjusted fluid droplet pattern can include a linear density of a row along the edge that is different from the linear density of a row away from the edge, dispensing fluid droplets of the formable material onto the substrate corresponding to the adjusted fluid droplet pattern, contacting the dispensed formable material with a template, solidifying the formable material under the template, separating the template from the solidified formable material to form a film layer on the substrate, and processing the substrate on which the film layer is produced to manufacture the article.

BRIEF DESCRIPTION OF THE DRAWINGS

Embodiments are illustrated by way of example and are not limited in the accompanying figures.

Figure 1:
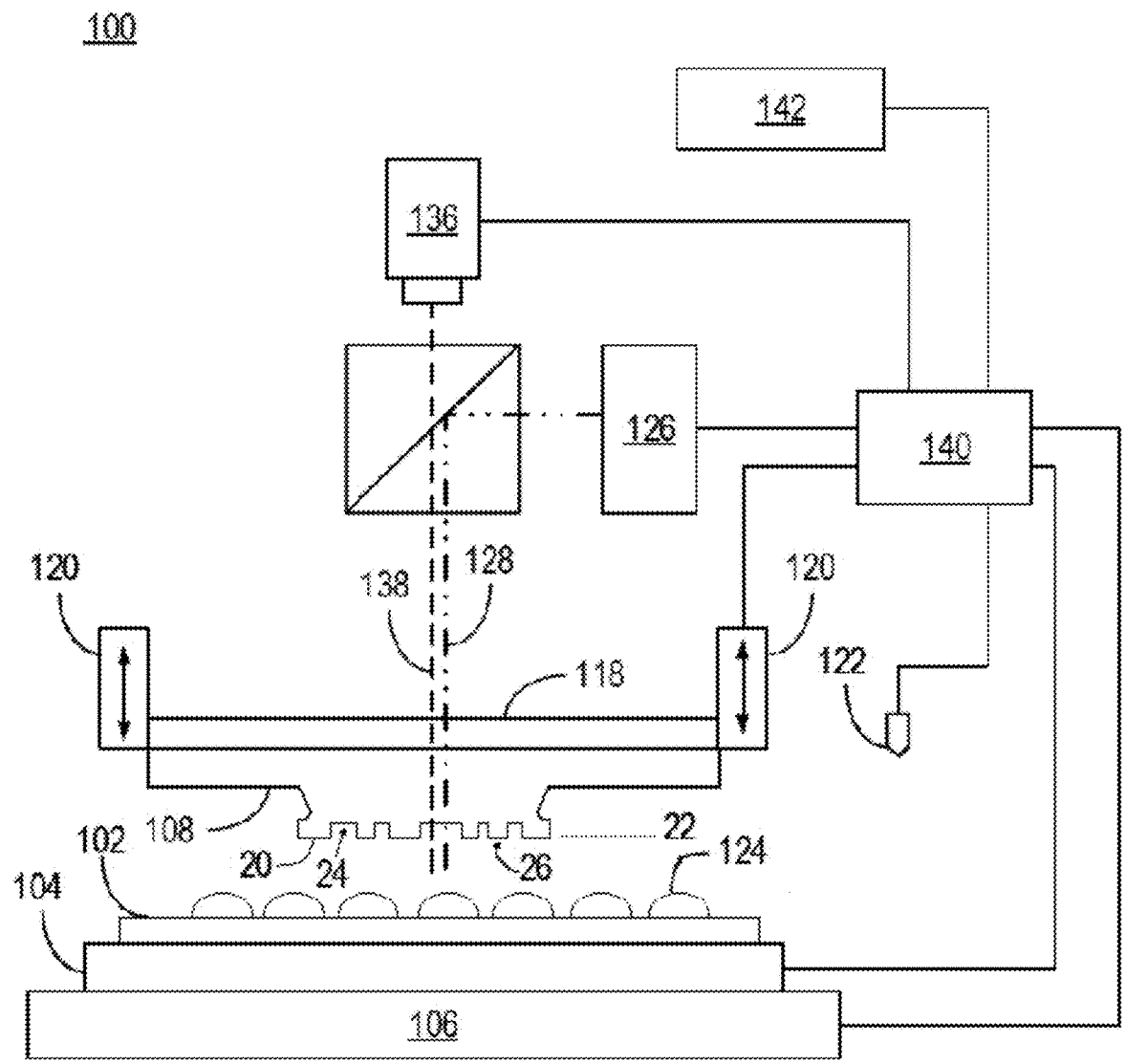
FIG. 1 includes an illustration of a side view of an exemplary imprint lithography system.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

The term "terminal fluid droplet," when a fluid droplet pattern is organized in rows, columns, or rows and columns, is intended to mean a fluid drop along such row or column that is closest to an edge of an imprint field. A row or column can have terminal fluid droplets at opposite ends of such row or column.

The term "drop edge exclusion" or "DEE" is defined by a shortest distance between a terminal fluid droplet and its adjacent edge of an imprint field and a line passing through centers of a set of terminal fluid droplets that are closest to such edge. Each edge can have a plurality of DEEs with each DEE corresponding to a row or column of fluid droplets.

The term "pitch" is intended to mean a distance from a center of a feature to a center of a next adjacent feature. For a fluid droplet pattern, the fluid droplet pitch is a distance from the center of a fluid droplet to the center of the next adjacent fluid droplet. In Cartesian coordinates, a two-dimensional pattern (a pattern as seen from a top view) can have a pitch in the X-direction that corresponds to the distance between the centers of the features as measured in the X-direction (X-direction pitch), and a pitch in the Y-direction that corresponds to the distance between the centers of the features as measured in the Y-direction (Y-direction pitch). The X-direction pitch may be the same or different from the Y-direction pitch.

As used herein, velocity and motion may be described on a relative basis. For example, object A and object B move relative to each other. Such terminology is intended to cover object A is moving, and object B is not; object A is not moving, and object B is moving; and both of objects A and B are moving.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

A fluid droplet pattern can be formed that allows for quicker filling of an imprint field without extrusion defects or other complications. The density of drops in a fluid droplet pattern is directly related to the substrate topography and the template topography, the volume requirements between the substrate and the template, and the spread characteristics of droplets due to the local topography. In an aspect, an apparatus for imprint lithography can include a logic element configured to generate a fluid droplet pattern of fluid droplets of a formable material to be dispensed onto a substrate. The fluid droplet pattern can include an imprint field, where the imprint field has an edge and drop edge exclusion zone along the edge. The apparatus for imprint lithography can be used for performing a method to form the fluid droplet pattern on the substrate.

Details regarding the apparatus and method are better understood after reading this specification in conjunction with figures. The description below is meant to illustrate embodiments and not limit the scope of the present invention, which is defined in the appended claims.

Referring to FIG. 1, an apparatus 100 in accordance with an embodiment described herein can be used to form a relief pattern on a substrate 102. The apparatus can be a lithographic system. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like. Exemplary chucks are described in U.S. Pat. No. 6,873,087, which is hereby incorporated by reference.

The substrate 102 and the substrate chuck 104 may be further supported by a substrate positioning stage 106. The substrate positioning stage 106 may provide translational and/or rotational motion along one or more of the x-, y-, z-, θ-, ψ, and φ-axes. The substrate positioning stage 106, the substrate 102, and the substrate chuck 104 may also be positioned on a base (not shown). The substrate positioning stage 106 may be a part of a positioning system.

Spaced apart from the substrate 102 is a template 108 having a patterned surface 22 facing substrate 102. Template 108 may include a body having a first side and a second side with one side having a mesa 20 extending therefrom towards the substrate 12. Mesa 20 may have a patterned surface 22 thereon. In one embodiment, the mesa 20 may be referred to as a mold 20. In another embodiment, the template 108 may be formed without a mesa 20. Template 108 and/or mold 20 may be formed from materials including, but not limited to, fused silica, quartz, silicon, organic polymers, siloxane polymers, borosilicate glass, fluorocarbon polymers, metal, hardened sapphire, and/or the like. In an embodiment, the template 108 is readily transparent to UV light. As illustrated, the patterned surface 22 may include featured defined by a plurality of spaced-apart recesses 24 and/or protrusions 26. Patterned surface 22 may define an original pattern that forms the basis of a pattern to be formed on the substrate 102. The mesa 20 can extend from the template 108 body at a thickness range of between 5 microns to 500 microns. The mesa 20 can both define an area of the pattern that will be imprinted on a substrate and prevent the remainder of the template from making contact with any part of the substrate being imprinted during an imprint process.

Template 108 may be coupled to or retained by a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. In an embodiment, the template chuck is likewise readily transparent to UV light. The template chuck 118 may include a system such as a zone based vacuum chuck, an actuator array, a pressure bladder, etc., which can apply a pressure differential to a back surface of the template 108 to cause the template to bend and deform. In one embodiment, the template chuck 118 includes a zone based vacuum chuck which can apply a pressure differential to a back surface of the template, causing the template to bend.

The template chuck 118 may be coupled to a patterning head 120 which is a part of the positioning system. The patterning head 120 may be movably coupled to a bridge. The patterning head 120 may include one or more actuators such as voice coil motors, piezoelectric motors, linear motor, nut and screw motor, etc., which are configured to move the template chuck 118 relative to the substrate 102 in at least the z-axis direction, and potentially other directions (e.g., x-, y-, θ-, ψ-, and φ-axis). Either the patterning head 120, substrate positioning stage 106, or both can vary a distance between the mold 20 and the substrate 102 to define a desired volume therebetween that is filled by formable material 124.

The formable material 124 can include a polymerizable material, such as a curable composition and/or an imprint resist. The formable material 124 can be positioned on the substrate 102 in one or more layers using techniques such as droplet dispense, spin-coating, dip coating, chemical vapor deposition (CVD), physical vapor deposition (PVD), thin film deposition, thick film deposition, or combinations thereof. The formable material 124 can be dispensed upon the substrate 102 before or after a desired volume is defined between the mold 20 and the substrate 102, depending on design considerations. In one embodiment, the formable material 124 can include a monomer mixture that can be cured using ultraviolet light, heat, or the like.

The apparatus 100 may further include a fluid dispenser 122. The fluid dispenser 122 may also be movably coupled to the bridge. In an embodiment, the fluid dispenser 122 and the patterning head 120 share one or more of all positioning components. In an alternative embodiment, the fluid dispenser 122 and the patterned head move independently from each other. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The apparatus 100 may further include a curing system that includes a radiation source 126 that directs actinic energy, for example, UV radiation, along an exposure path 128. The patterning head 120 and the substrate positioning stage 106 may be configured to position the template 108 and the substrate 102 in superimposition with the exposure path 128. The radiation source 126 sends the actinic energy along the exposure path 128 after the template 108 has contacted the formable material 124. FIG. 1 illustrates the exposure path 128 when the template 108 is not in contact with the formable material 124. This is done for illustrative purposes so that the relative position of the individual components can be easily identified. An individual skilled in the art would understand that exposure path 128 would not substantially change when the template 108 is brought into contact with the formable material 124.

The apparatus 100 may further include a camera 136 positioned to view the spread of formable material 124 as the template 108 contacts the formable material 124 during the imprinting process. FIG. 1 illustrates an optical axis 138 of the field camera's imaging field. As illustrated in FIG. 1, the apparatus 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the template 108 and in contact with the formable material 124 and regions underneath the template 108 but not in contact with the formable material 124. The camera 136 may be configured to provide images of the spread of formable material 124 underneath the template 108, and/or the separation of the template 108 from cured formable material 124. The camera 136 may also be configured to measure interference fringes, which change as the formable material 124 spreads between the gap between the patterned surface 22 and the substrate surface.

The apparatus 100 may be regulated, controlled, and/or directed by one or more processors 140 (controller) in communication with one or more components and/or subsystems such as the substrate chuck 104, the substrate positioning stage 106, the template chuck 118, the patterning head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

In operation, either the patterning head 120, the substrate position stage 106, or both vary a distance between the template 108 and the substrate 102 to define a desired space (a bounded physical extent in three dimensions) that is filled with the formable material 124. For example, the patterning head 120 may be moved toward the substrate and apply a force to the template 108 such that the template 108 contacts and spreads droplets of the formable material 124.

While the formation of a patterned layer over the substrate 102 using the formable material 124 seems relatively simple on a conceptual basis, patterning a layer is significantly difficult, particularly in view of the small dimensions, and in particular in trying to avoid direct contact between the template 108 and the substrate 102, and desire for high throughput for the apparatus 100. In this specification, new fluid droplet patterns can be used to achieve relatively high volume production for the apparatus and without increasing defects, such as extrusion defects, non-fill defects, or non-uniform residual layer thickness defects.

Traditionally, uniform DEEs were used along an edge of an imprint field by altering the distances for DEEs to be uniformly larger or uniformly smaller. However, such alternatives can cause problems as differences in the local filing time and spreading time can lead to extrusion defects, non-fill defects, or non-uniform residual layer thickness (RLT) defects. An extrusion defect is a portion of a resist layer that extends beyond any border of the mesa 20 surface during the imprint process. Such extruded material can accumulate on the mesa sidewalls and subsequently solidify upon exposure to actinic radiation. During separation of the template 108 from the substrate 102 following the curing of the formable material 124, the extruded, cured material can remain on the mesa sidewall of the template 108, creating a defect that negatively affects subsequent processing. The accumulated material can eventually break off and cause a defect on the substrate. As formable material 124 is dispensed along horizontal, vertical, or diagonal stitching lines during multi-pass drops, several defects can appear from the misalignment during the various passes. For example, if the multiple passes at the stitch line are farther apart than the pitch of the pattern, a non-fill extrusion can be seen. If the multiple passes at the stitch line are closer together than the pitch of the pattern, non-uniform RLT defects or thicker rows can be seen.

However, adjusting the fluid droplet pattern at the edge of the imprint field by accounting for the linear density along the edge of the imprint field advantageously synchronizes the spreading/filling along the entirety of the field edge as compared to droplet pattern having uniform drops along the edges of the imprint field. Thus, a variable DEE approach accounting for the linear density along the edge provides for a better balance of extrusion control and non-fill control.

Figure 2:
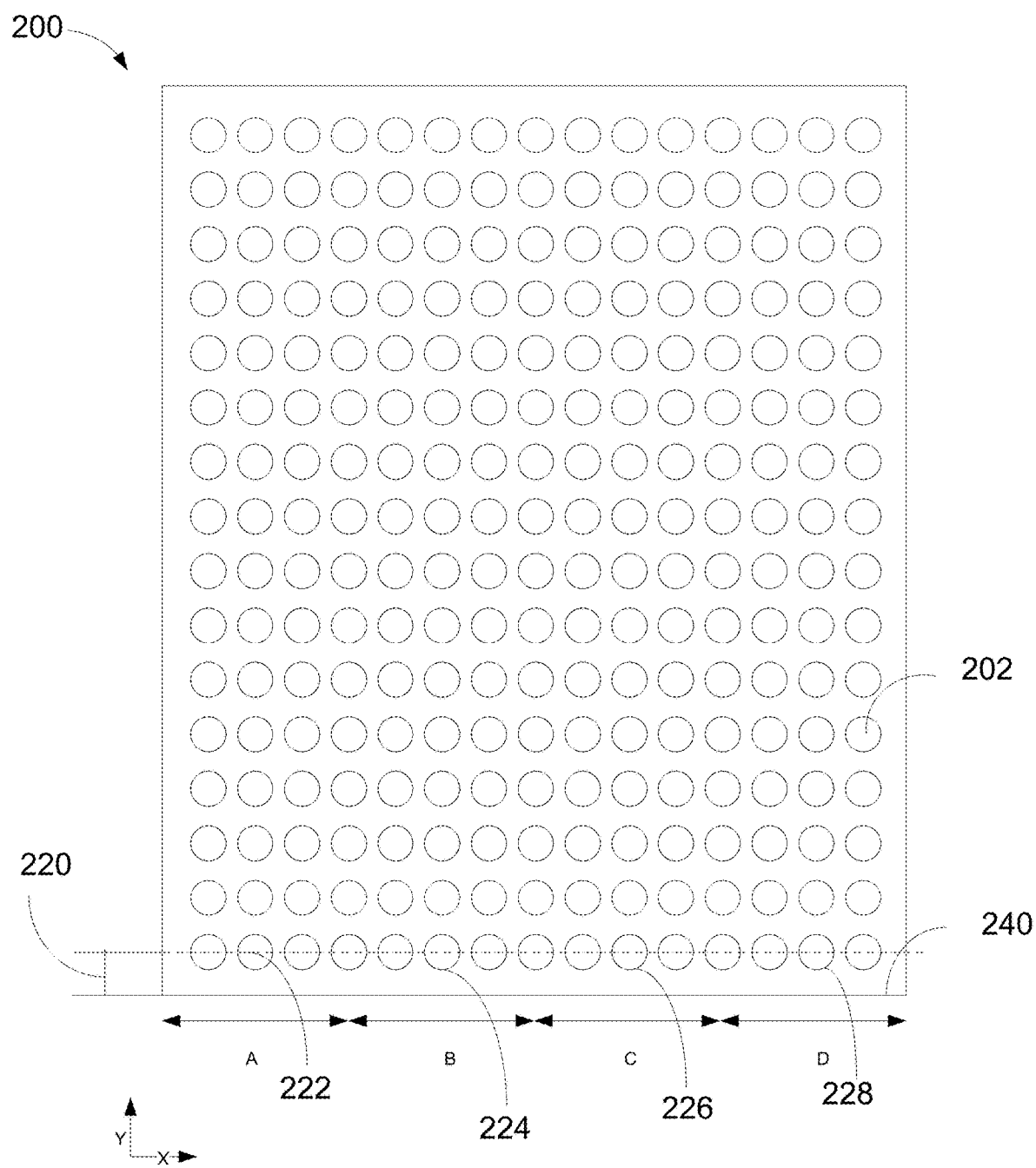
FIG. 2 includes an illustration of a fluid droplet pattern.

FIG. 2 illustrates a portion of a fluid droplet pattern 200. The fluid droplet pattern 200 is made up of fluid droplets 202 of the formable material 124 which is disposed within an imprint field. The imprint field has an edge 240 that coincides with edges of the mesa 20 and mesa sidewalls of the template 108. In an embodiment, the fluid droplet pattern 200 is organized in rows, and each row includes a terminal fluid droplet along the edge 240. The rows of the fluid droplet pattern 200 extend in a translating direction, which is the direction in which the substrate 102 and the template 108 move relative to each other. Fluid droplets 202 are dispensed in the translating direction at a translating fluid droplet pitch. As used in this specification, the translating direction is referred as the x-direction, and the translating fluid droplet pitch is an X-direction pitch. The fluid dispenser 122 may include a series of nozzles that have a fixed nozzle pitch between each of the nozzles. The Y-direction pitch of a drop pattern is limited by the dispensable locations of the apparatus 100. Y-direction pitch is directly correlated to the nozzle pitch of the dispenser. In an embodiment, the Y-direction pitch may be adjusted by rotating the fluid dispenser 122 relative to the translating direction. In an embodiment, the Y-direction pitch may be adjusted by performing multiple interleaved passes of the fluid dispenser 122 in the translating direction.

The drop exclusion zone (DEZ) 220 is the area between the edge 240 and the dashed line that passes through the terminal fluid droplets, including terminal fluid droplets 222, 224, 226, and 228. For the fluid droplet pattern 200 illustrated in FIG. 2, the terminal fluid droplets 222, 224, 226, and 228 have corresponding DEEs, respectively. The fluid droplet 222 can be part of a grouping A of droplets that have a linear density of drops at the imprint field edge. The linear density at an imprint field edge is directly related to the volume requirements near the imprint field edge 240. When the volume requirements near the imprint field edge 240 are high then the linear density of drops at the imprint field edge is also high. The fluid droplet 224 can be part of a grouping B of droplets that have a linear density of drops at the imprint field edge. The fluid droplet 226 can be part of a grouping C of droplets have a linear density of drops at the imprint field edge. The fluid droplet 228 can be part of a grouping D of droplets that have a linear density of drops at the imprint field edge. In an embodiment, the linear density of grouping A can be different from the linear density of grouping B, different from the linear density of grouping C, and different from the linear density of grouping D. Those different linear densities can affect local filling times and lead to extrusion defects or non-fill defects. Making uniform changes to an entire column or row can increase the number of defects at the edge of the imprint field. Thus, as will be described in more detail later in this specification, utilizing drops with different densities to obtain an optimum DEE near the edge of the imprint reduces non-fill defects, extrusion defects, and non-uniform RLT defects.

Figure 3:
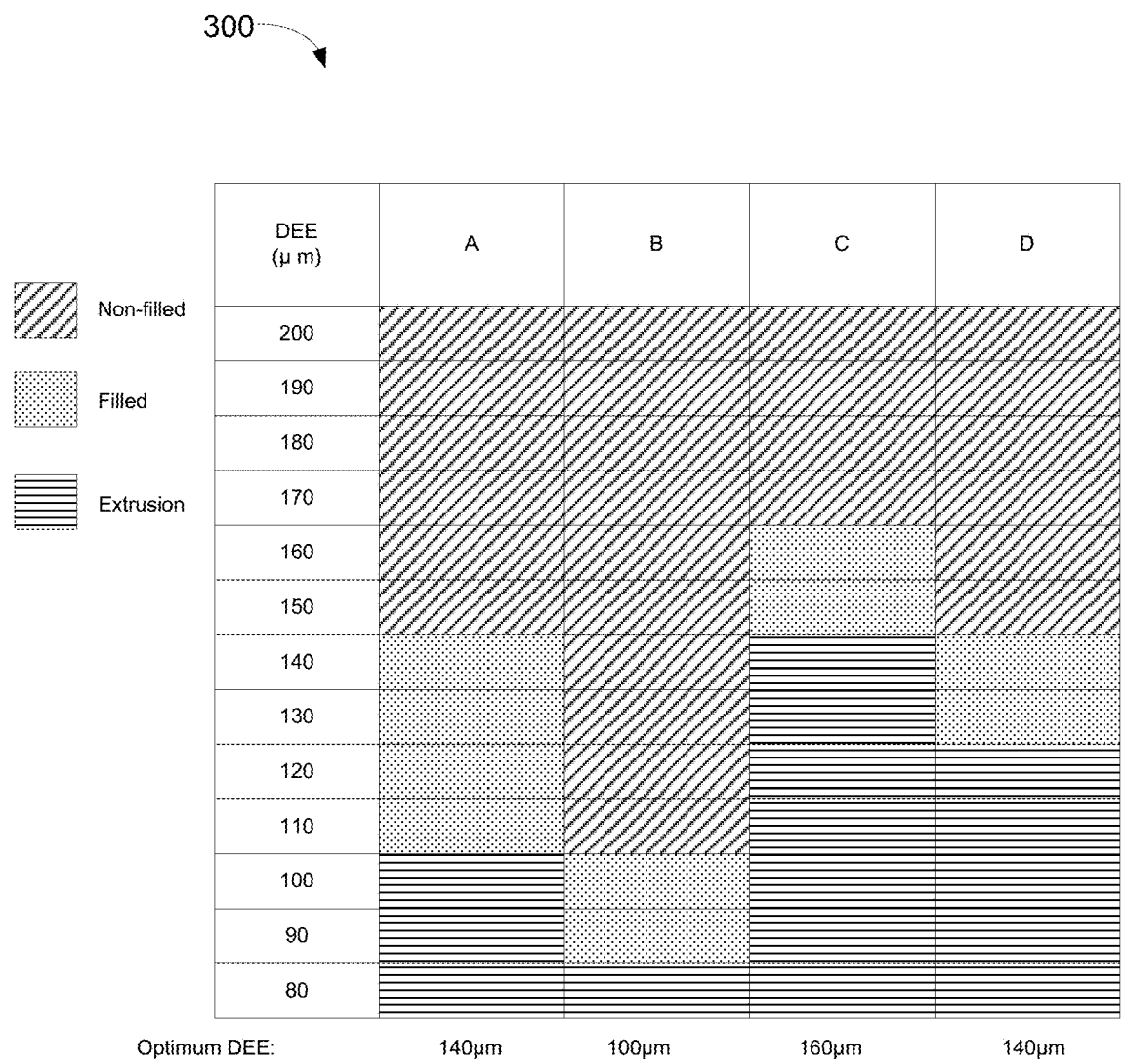
FIG. 3 includes an illustration of an optimum drop edge exclusion chart.

The optimum DEE is the largest DEE in which all features are filled. FIG. 3 illustrates a chart 300 with example optimum DEE for the droplets along the dotted line, adjacent edge 240 of FIG. 2. The droplets have been combined into the groupings A, B, C, and D. As way of example and seen in FIG. 3, the optimum DEE for A is 140 µm, the optimum DEE for B is 100 µm, the optimum DEE for C is 160 µm, and the optimum DEE for D is 140 µm. The data for chart 300 was generated by imprinting test wafers with test drop patterns that have different DEE. The edges of the imprinted fields were then inspected for extrusion and non-fill defects. Simulation methods may also be used to estimate the optimum DEE values along an imprint field edge 240. In another embodiment, the optimum DEE for each grouping of A, B, C, and D could be higher or lower. The optimum DEE for the imprint field can vary depending on the geography or topography of the substrate and template. For example, grating type features can speed up the spread of droplets in one direction relative to another direction. For example, fluid in thinner gaps may spread faster than fluid in thicker gaps due to variation in capillary pressure. The optimum DEE for each grouping can then be used to determine mean of the optimum DEE adjacent the edge 240. The DEZ along edges of the imprint field can be obtained using different equipment configurations and techniques, some of which are described and illustrated herein. In one or more of the previous embodiments, portions of the fluid droplet pattern may be stitched together to keep the fluid droplet pitch more uniform in the translating direction. After reading this specification, skilled artisans will appreciate that other embodiments can be used without departing from the concepts as described here.

Figure 4:
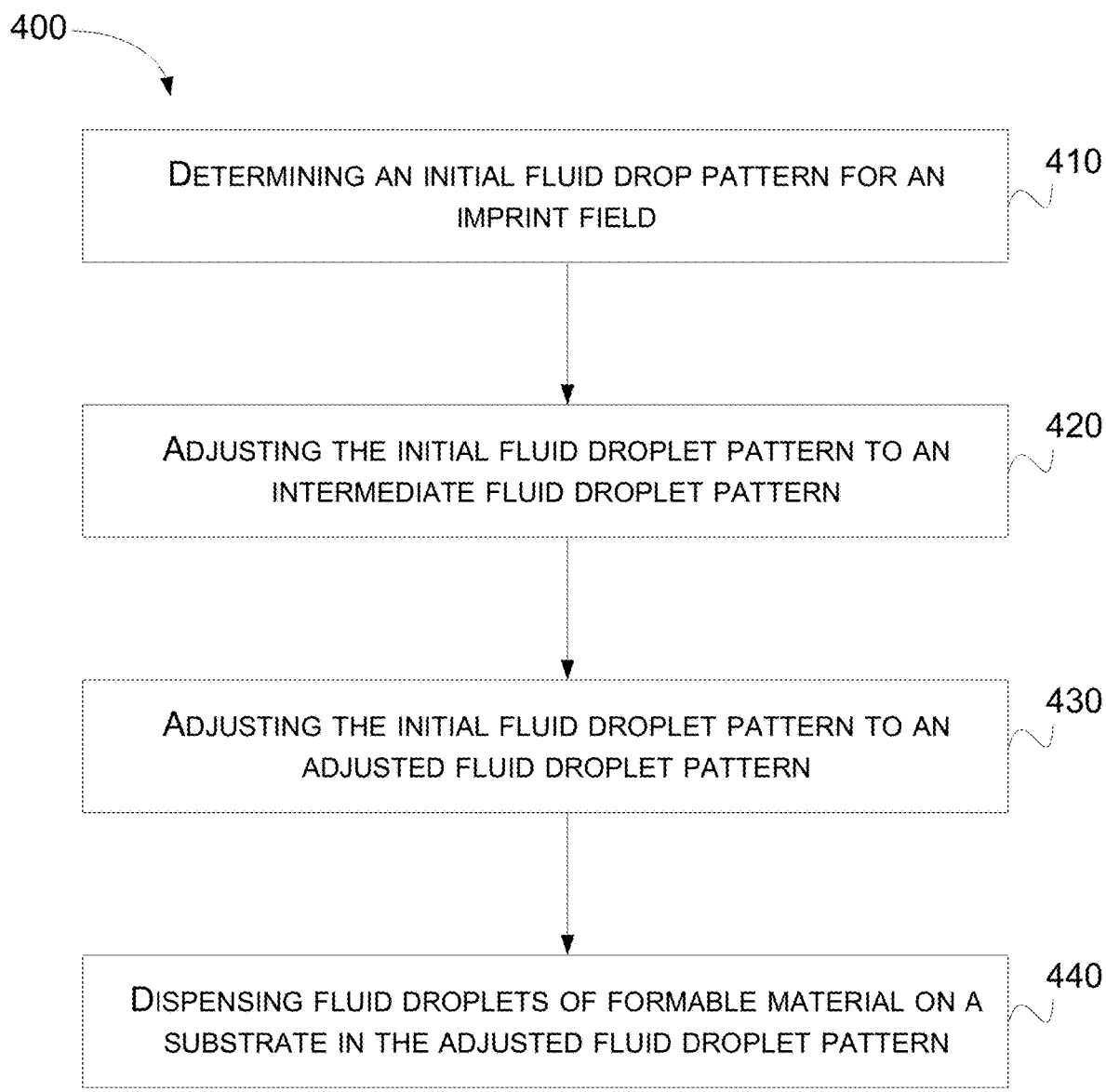
FIG. 4 includes a flow chart of an exemplary method of forming an article, including generating a fluid droplet pattern using the apparatus of FIG. 1.

In accordance with an embodiment described herein, FIG. 4 includes a flow chart for a method 400 that can be used to form a substrate fluid droplet pattern for an imprint lithography process. The method is better understood with respect to the apparatus 100 in FIG. 1, fluid droplet pattern of FIG. 2, the chart of optimum DEEs of FIG. 3, and the patterns of FIG. 5. The method can be performed by an imprint lithography apparatus including a fluid dispense system, a stage, and a logic element, such as seen in FIG. 1.

The method can include determining an initial fluid droplet pattern of fluid droplets of a formable material, at block 410. At this point in the process, the initial fluid droplet pattern can be virtual pattern generated by the logic element. The logic element can include hardware, firmware, software, or any combination thereof to perform many of the operations described herein. In a particular embodiment, the logic element can be the processor 140. The logic element may use a hardware and processing unit of the apparatus 100 when determining the initial fluid droplet pattern. The initial fluid droplet pattern can include an initial drop exclusion zone (DEE) 220 relative to the imprint field edge 240 and an initial linear density of drops at the imprint field edge, as seen in FIG. 2.

The method 400 can include determining the optimum DEE for the row along the imprint field edge 240 of the initial fluid droplet pattern. In one embodiment, determining the optimum DEE for the row along the imprint field edge 240 can include finding the largest DEE in which all features are filled for each of the groupings A, B, C, and D, for example as seen in FIG. 3. Once the optimum DEE for each grouping is determined, the mean optimum DEE for the entire row can then be calculated by taking the mean from the groupings. For example, if the optimum DEE for A was 100 µm, the optimum DEE for B was 140 µm, the optimum DEE for C was 100 µm, and the optimum DEE for D was 60 µm, then the mean optimum DEE would be 100 µm. In another example, and as seen in FIG. 3, if the optimum DEE for A was 140 µm, the optimum DEE for B was 100 µm, the optimum DEE for C was 160 µm, and the optimum DEE for D was 140 µm, then the mean optimum DEE would be 135 µm.

Figures 5A, 5B:
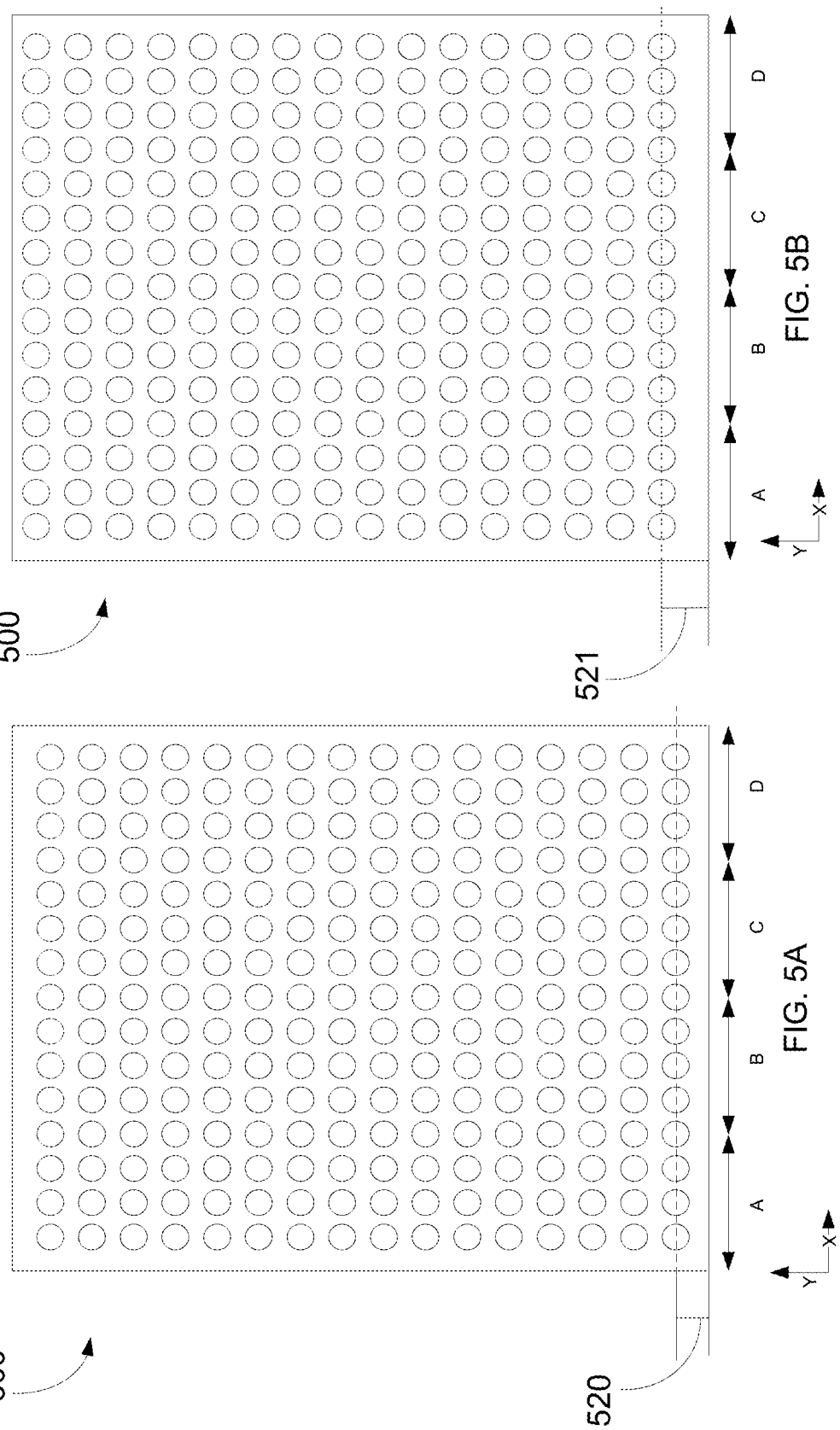
FIGS. 5A-5D include an illustration of fluid droplet patterns, according to various embodiments.
Figure 5C:
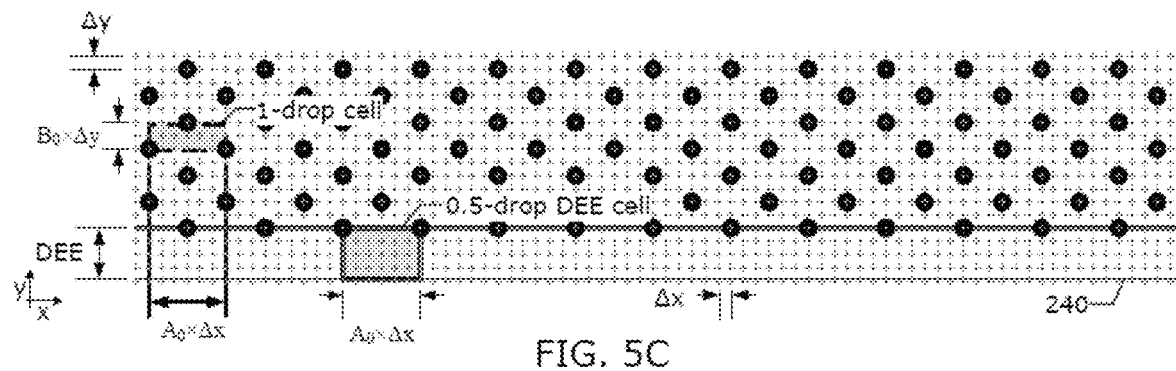

The method 400 can further include adjusting the initial fluid droplet pattern to an intermediate fluid droplet pattern, at block 420. In one embodiment, adjusting the initial fluid droplet pattern to the intermediate fluid droplet pattern can include moving the row adjacent the imprint field edge 240 to the mean optimum DEE, at block 420. For example, if the initial DEE 520 for the row adjacent the imprint field edge 240 was 100 µm, as seen in FIG. 5A and the mean optimum DEE 521 was 135 µm, the fluid droplet pattern of the imprint field 500 is moved such that the row adjacent the imprint field edge 240 in the intermediate pattern has a DEE 521 that is now 135 µm, as seen in FIG. 5B. In one embodiment, the intermediate fluid droplet pattern is moved vertically with respect to the imprint field edge 240. Since the DEE of the intermediate pattern is now different from the initial fluid droplet pattern, without further adjustments, there could be several defects, such as non-fill or extrusion defects within the imprint field. FIG. 5C is an illustration of a portion of a staggered grid (diamond) intermediate fluid droplet pattern adjacent the imprint field edge 240. The intermediate fluid droplet pattern is limited by a minimum drop pitch ($\Delta x$, $\Delta y$) of the fluid dispenser 122 and the positioning system, this limitation is represented by the grid of grey pluses in FIG. 5C as dispensable positions of the apparatus 100. Along the translation direction (X-direction), there is a limit to how close two drops can be dispensed that is limited by the number of passes, the stage drive speed, and the dispense rate of the dispenser. If a nozzle ejects formable material to soon after previously being ejecting formable material, the volume of material ejected becomes unreliable. These limitations require that there be a minimum distance between dispensable locations in drop pattern. This minimum distance may be referred to as "step" or a minimum X-direction pitch ($\Delta x$). In the Y-direction, the "step" or a minimum Y-direction pitch ($\Delta y$) is limited by the mechanical arrangement of nozzles on the dispenser and the number of passes that dispenser makes over an imprint field. For simplicity, the minimum X-direction pitch ($\Delta x$) is typically set to be equal to the minimum Y-direction pitch ($\Delta y$), but this is not necessary for practicing an embodiment. The dispensable positions may be adjusted relative to the imprint field edge 240 with an accuracy that is a fraction of the minimum drop pitch ($\Delta x$, $\Delta y$) and is limited by the accuracy and/or precision of the positioning system but may be constant across the imprint field for each pass of the fluid dispenser 122 over the imprint field. The local drop density may be calculated in the center of the intermediate drop pattern terms of the minimum drop pitch ($\Delta x$, $\Delta y$). For example, as illustrated in FIG. 5C there is a unit cell (dashed lines) that includes 1 drop per $6 \times \Delta x$ by $2 \times \Delta y$ area ($1/(6 \times \Delta x \times \Delta y)$). This may be generalized when drop patterns are described in terms of multiples of the minimum drop pitch for example, a drop pattern may have 1 drop per $A_0 \times \Delta x$ by $B_0 \times \Delta y$ area as described equation (1). In which $A_0$ is an x-direction multiple and $B_0$ is the y-direction multiple. Not all drop patterns may be described by a unit cell with only 1 drop per repeating cell, in which case equation (1) may be modified by a scaling factor. The optimum DEE is illustrated by a double black line.

$$\text{drop density} = \frac{1}{A_0 \times \Delta x \times B_0 \times \Delta y} \quad (1)$$

Another property of the intermediate fluid droplet pattern is an edge density $\lambda$ of drops along the imprint field edge 240, which may be calculated using a similar process. For example, as illustrated in FIG. 5C which shows a half drop per $6 \times \Delta x$ by DEE area ($\lambda = 1/(12 \times \Delta x \times DEE)$). More generally, there are $j$ drops per $A_0 \times \Delta x$ by DEE area as described by equation (2). The DEE scaling factor $j$ may be 0.5, as illustrated in FIG. 5C but may be any real positive number.

$$\lambda = \frac{j}{A_0 \times \Delta x \times DEE} \quad (2)$$

Figure 5D:
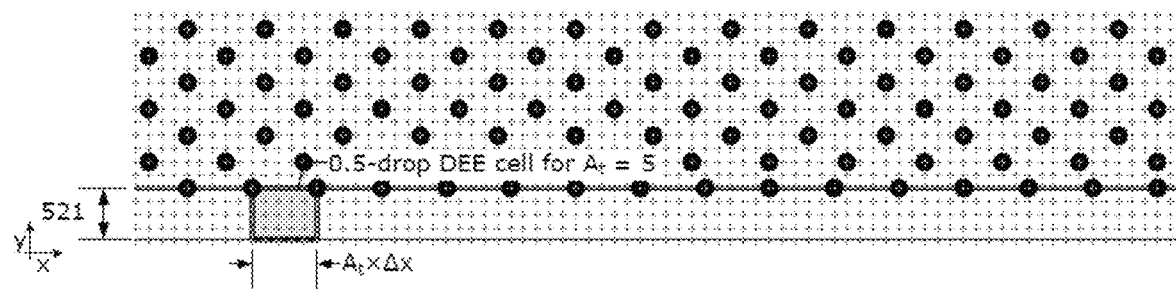

As such, the method 400 can continue by determining a set of adjusted DEEs based on one or all of the following: a set of test linear drop densities (X) at the imprint field edge, the average of the set of desired DEEs, drop pitch offsets from the average new DEEs and the intermediate drop pattern at the imprint field edge. FIG. 5D is an illustration of a test drop pattern in which the drops at the imprint field edge have an adjusted linear drop density of 1 drop every 5 times minimum drop pitches ($5 \times \Delta x$). In the example illustrated in FIG. 5D, the original drop pattern had a drop every 6 times minimum drop pitches ($6 \times \Delta x$). So, for every 6 minimum drop pitches, there is 6/5 of a drop in the last row for 6 times minimum drop pitches ($6 \times \Delta x$). The applicant has found that the test edge drop density $\lambda_t$ may be calculated in terms of the half drop relative the original drop pattern for example ($\lambda_t = (6/5 - 0.5)/(DEE \times 6 \times 35) = (7/(DEE \times 6 \times 35 \times 10)$. More generally, there are $j_t$ drops per $A_t \times \Delta x$ for every $A_0 \times \Delta x$ unit area as described by equation (3) below. The test DEE scaling factor $j_t$ may be 0.5, as illustrated in FIG. 5C but may be any real positive number. The test DEE scaling factor $j_t$ is used because half of the terminal drop is used to fill the DEZ and the other half fills the imprint field.

$$\lambda_t = \frac{\frac{A_0}{A_t} - j_t}{A_0 \times \Delta x \times DEE} = \frac{A_0 - j_t \times A_t}{A_t \times A_0 \times \Delta x \times DEE} = \frac{1}{A_t \times \Delta x \times DEE} - \frac{j_t}{A_0 \times \Delta x \times DEE} \quad (3)$$

In one embodiment, an equivalent DEE (EDEE) is calculated using the formula (4) below which describes an EDEE in terms of the new linear drop pattern of the terminal drops and the drop pattern of the drops adjacent to the terminal drops including the scaling factors of the original drop pattern and the new drop pattern. The EDEE converts the DEE of the new drop pattern to the DEE of the natural drop pattern based on equal linear density. The natural drop pattern is the pattern of drops adjacent to the terminal drops and is characterized by the x-direction multiple $A_0$ and the scaling factor $j$. Utilizing the EDEE, the optimum DEE, and a step configuration of the natural drop pattern, a new drop pattern is chosen. Based on the new drop pattern, an adjusted DEE is determined.

$$\lambda_t = \frac{\frac{A_0}{A_t} - j_t}{A_0 \times \Delta x \times DEE} = \frac{j}{A_0 \times \Delta x \times EDEE} \quad (4)$$

$$(A_0 \times \Delta x \times EDEE) \times \left(\frac{A_0}{A_t} - j_t\right) = (A_0 \times \Delta x \times DEE) \times j$$

$$EDEE = \frac{j}{\left(\frac{A_0}{A_t} - j_t\right)} DEE$$

Figure 6A:
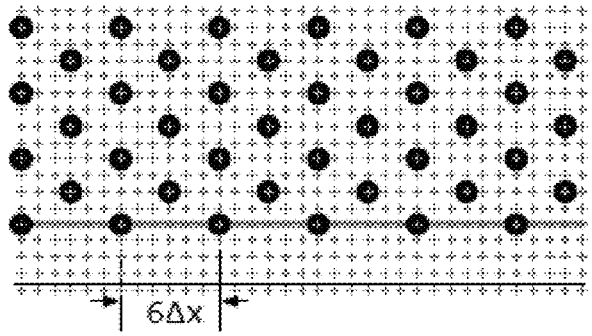
FIGS. 6A-6L include illustrations of step configurations used in the fluid droplet pattern, according to one embodiment.
Figure 6B:
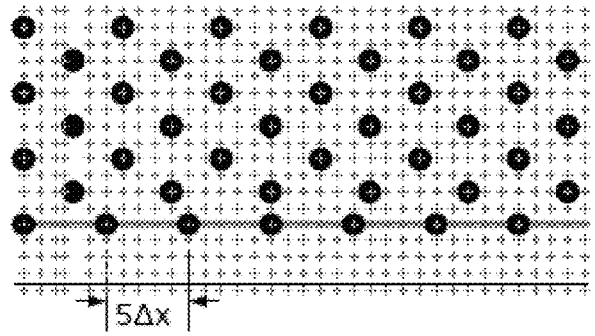
Figure 6C:
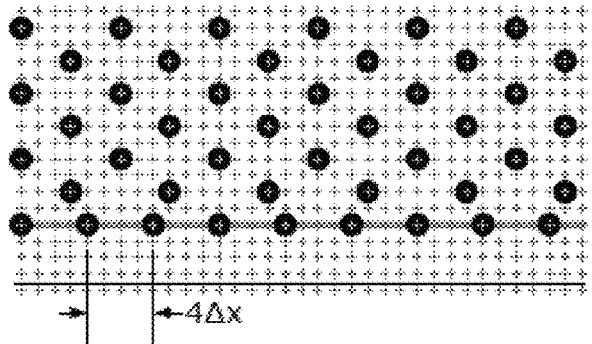
Figure 6D:
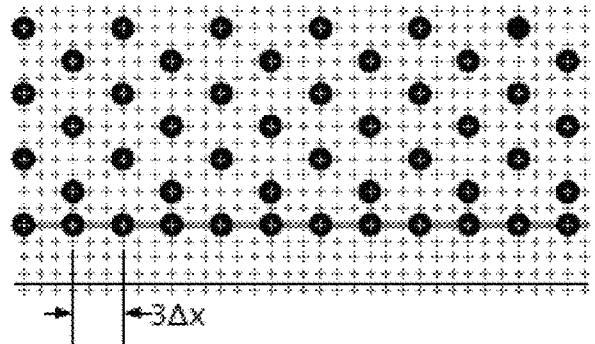
Figure 6E:
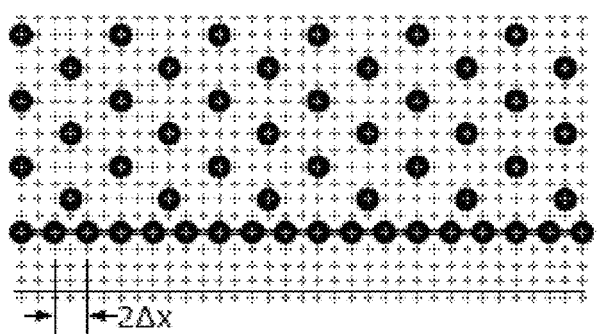
Figure 6F:
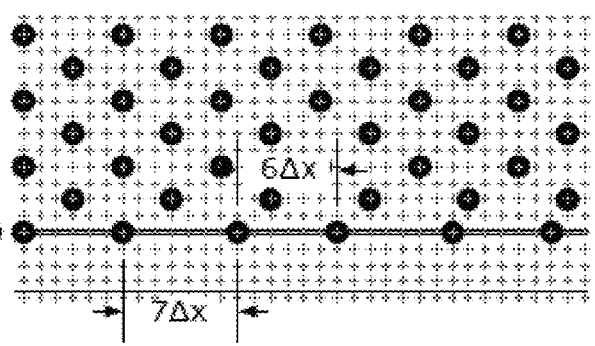
Figure 6G:
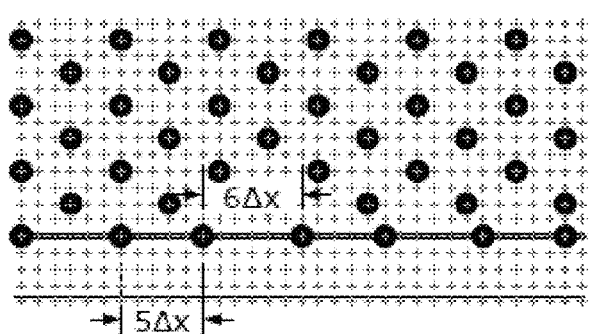
Figure 6H:
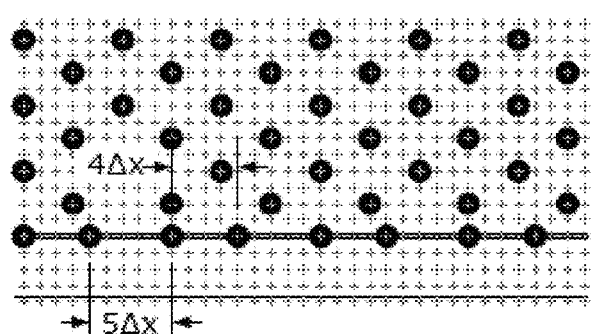
Figures 6I, 6J:
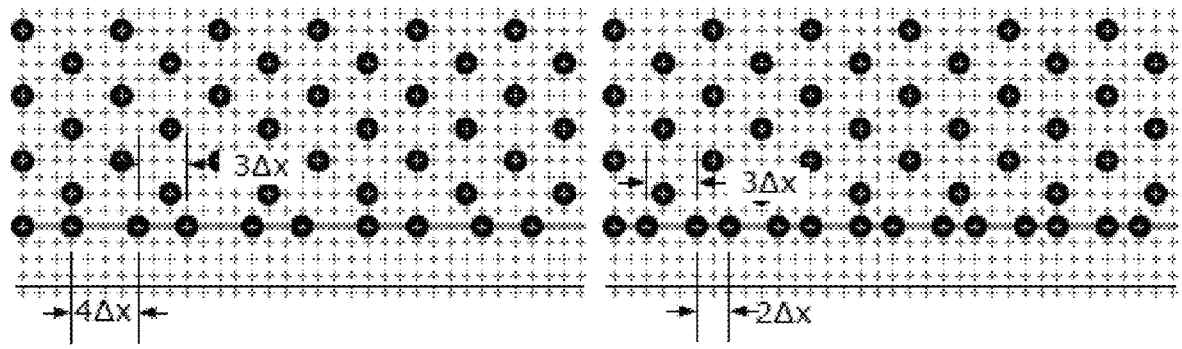

The step configuration is based on the drop pattern of the imprint field prior to any changes, i.e., the natural drop pattern for example as seen in FIG. 5A. FIGS. 6A-6J are illustrations of various different step configurations near an edge of an imprint. FIG. 6A is an illustration of a 6 step configuration where at the edge of the imprint field, the drops have a pitch in the X-direction that is 6. A "# step configuration" describes the linear density of drops in which # ($A_0$, $B_0$) is multiplied by the step (minimum X-direction pitch or minimum Y-direction pitch) to describe the distance between individual drops in the drop pattern. FIG. 6B is an illustration of a 5 step configuration where at the edge of the imprint field, the drops have a pitch in the X-direction that is a 5. FIG. 6C is an illustration of a 4 step configuration where at the edge of the imprint field, the drops have a pitch in the X-direction that is a 4. FIG. 6D is an illustration of a 3 step configuration where at the edge of the imprint field, the drops have a pitch in the X-direction that is a 3. FIG. 6E is an illustration of a 2 step configuration where at the edge of the imprint field, the drops have a pitch in the X-direction that is a 2. FIG. 6F is an illustration of a 6,7 step configuration where at the edge of the imprint field, the drops have different pitches in the X-direction that alternate from 6 to 7. A "#1,#2 step configuration" where there are two different pitches are interlaced. Interlacing two different pitches means having a pattern of drops that is repeated. The pattern includes a first drop that is separated from a second drop by a distance of #1 times the step. The pattern also includes a third drop that is separated from the second drop by a distance #2. This pattern is repeated for example a fourth drop will be separated from the third drop by a distance #1. The applicant has found that RLT uniformity is improved if #1 and #2 are two positive integers that are different from each other by 1 or 2. FIG. 6G is an illustration of a 5,6 step configuration where at the edge of the imprint field, the drops have different pitches in the X-direction that alternate from 5 to 6. FIG. 6H is an illustration of a 4,5 step configuration where at the edge of the imprint field, the drops have different pitches in the X-direction that alternate from 4 to 5. FIG. 6I is an illustration of a 3,4 step configuration where at the edge of the imprint field, the drops have different pitches in the X-direction that alternate from 3 to 4. FIG. 6J is an illustration of a 2,3 step configuration where at the edge of the imprint field, the drops have different pitches in the X-direction that alternate from 2 to 3. The EDEE may be estimated using a variation of equation (4) in which the test multiple $A_t$ is replaced with an average $A_t$ as shown in equation (5) below. Equation (6) below shows how the equation may be inverted so that an average $A_t$ may be determined if a Target DEE is known.

$$EDEE = \frac{j}{\left(\frac{A_0}{\text{Average}(A_t)} - j_t\right)} DEE \quad (5)$$

$$\text{Average}(A_t) = \left(\frac{A_0 \times \text{Target\_DEE}}{j \times DEE + j_t \times \text{Target\_DEE}}\right) \quad (6)$$

Utilizing the EDEE, the optimum DEE, and a step configuration of the natural drop pattern, a new drop pattern is chosen. For example, the graph in FIG. 7 shows how the new pattern is chosen at each respective area: A, B, C, and D. In one embodiment, a line of drops are removed from the edge before a new drop pattern is chosen. In one embodiment, a line of drops are added to the edge before a new drop pattern is chosen. In yet another embodiment, no additional changes are made to the drops at the edge of the field before a new drop pattern is chosen. In either adding a line, removing a line, or maintaining the line of drops at the edge of the imprint field, the linear density at the edge of the imprint field is adjusted independently from the density of the rest of the imprint field. As such, the adjusted DEE is determined from the EDEE, optimum DEE, and step configuration of the drop pattern. Equations 5 and 6 describe the situation in which the linear density of the terminal drops is adjusted. These equations may be modified to describe adding or removing drops and shifting the terminal drops by the minimum pitch in the y-direction times the y-direction multiple $B_0$ as described by equations (7-8). The integer n={−1, 0, 1}. When the integer n=−1 then the row of drops with a step of average ($A_t$) are added to the drop pattern at a distance $B_0$ from the DEE which produces an EDEE. When the integer n=0 then the drops along the DEE are adjusted to have an average ($A_t$). When the integer n=1 then the drops along the DEE are removed and the drops at a distance $B_0$ from the DEE are adjusted to have a step of average ($A_t$) which produces an EDEE. In a preferred embodiment, n=−1,0,1 which improves RLT uniformity, if RLT uniformity is not important or is adjusted by other means then n may be other integers.

$$EDEE = \frac{j}{\left(\frac{A_0}{\text{Average}(A_t)} - j_t\right)}(DEE + n \times (B_0 \times \Delta y)) \quad (7)$$

$$\text{Average}(A_t) = \left(\frac{A_0 \times \text{Target\_DEE}}{j \times (DEE + n \times (B_0 \times \Delta y)) + j_t \times \text{Target\_DEE}}\right) \quad (8)$$

Figure 6K:
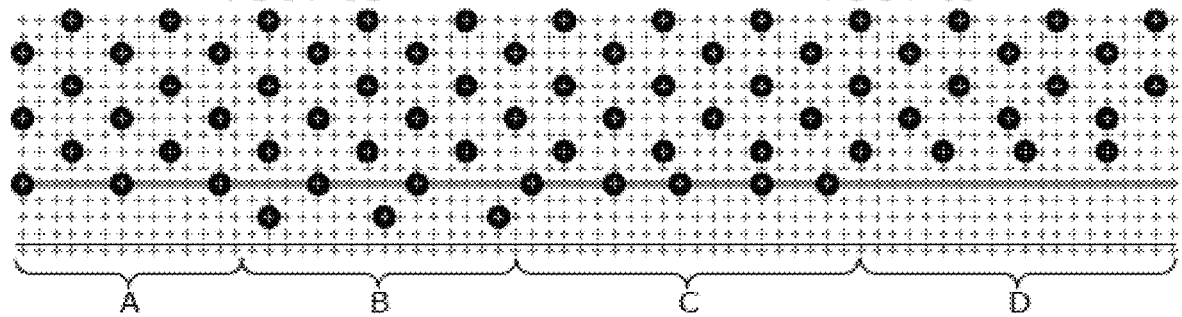
Figure 6L:
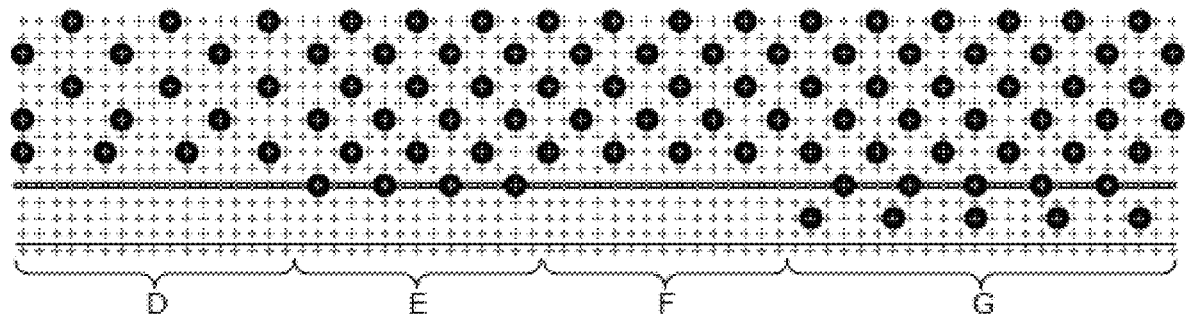
Figure 7A:
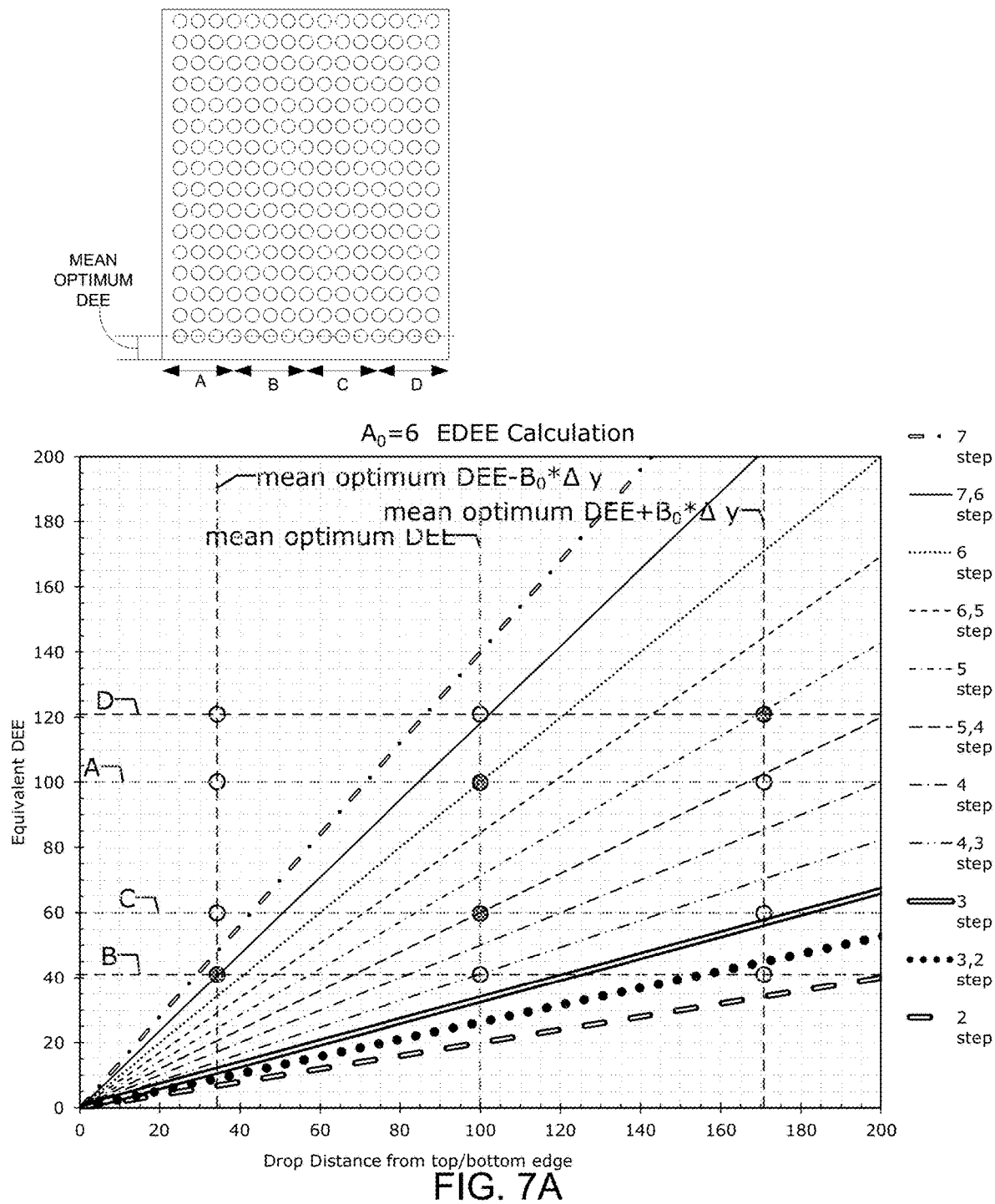
FIGS. 7A and 7B include a graph of determining the equivalent DEE based from the mean optimum DEE, the optimum DEE, and the step configuration, according to one embodiment.
Figure 7B:
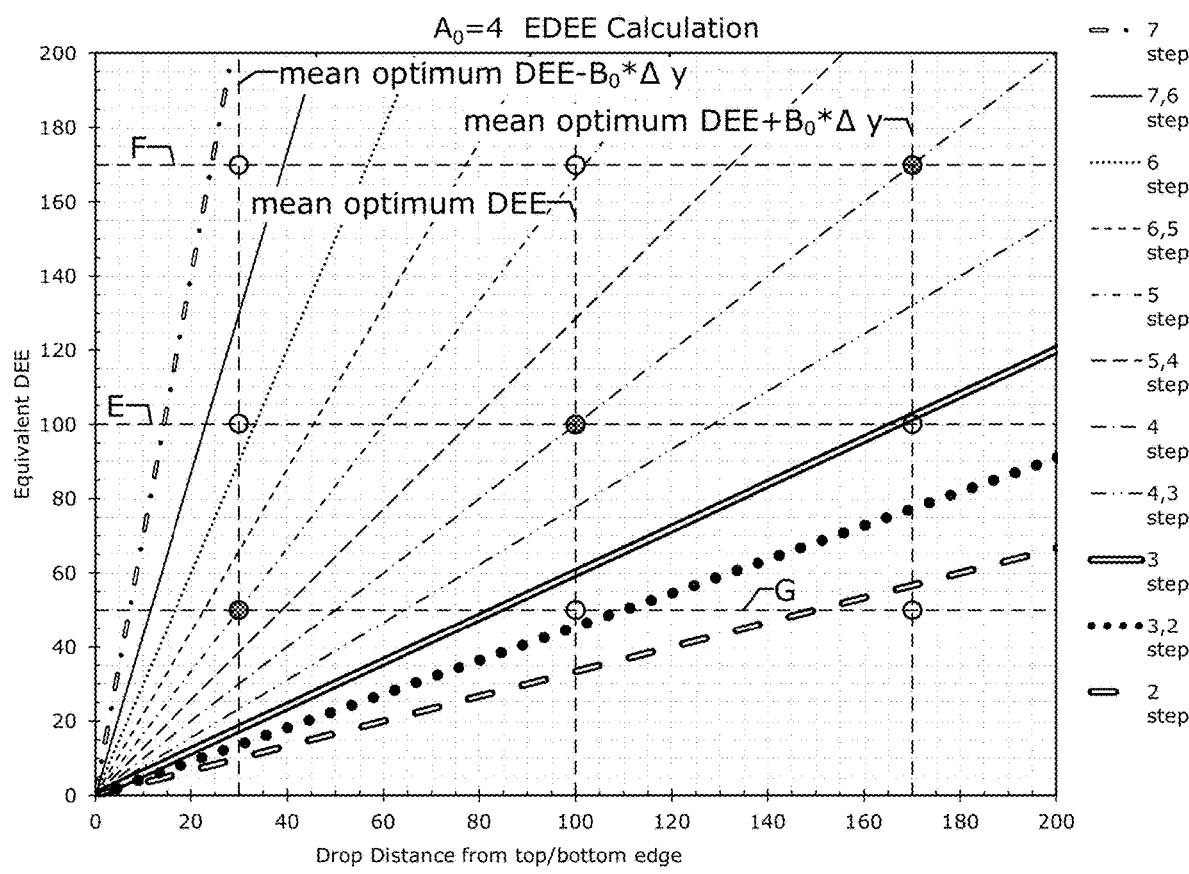

FIG. 7A shows an exemplary chart of the method described above for A=6 and n=1-2, 0, 2). In FIG. 7A, regions A, B, C, and D have a calculated mean optimum DEE of 100 µm. The mean optimum DEE may be a weighted average that is weighted based on the relative length of each region along the imprint field edge. The optimum DEE for A, B, C, and D in FIG. 7 is as follows: region A the optimum DEE is 100 µm, region B the optimum DEE is 42 µm, region C the optimum DEE is 60 µm, and region D the optimum DEE is 121 µm. By utilizing the graph in FIG. 7A, an EDEE can be calculated for each section by determining the drop pattern for each region, using the multiples ($A_0$ and $B_0$) of that region. For region A, the drop pattern is a 6 step, for region B the drop pattern is a 7 step after adding one row of drops, for region C the drop pattern is a 5,4 step, and for region D the drop pattern is a 5 step after removing one row of drops as illustrated in FIG. 6K. FIG. 7B is an illustration of another exemplary chart of the method described above for multiple $A_0$=4 and $B_0$={−2,0, 2}. This is for the same imprint field edge as the chart in FIG. 7A, so it has the same mean optimum DEE of 100 µm. The optimum DEE for regions E, F, and G is as follows: region E the optimum DEE is 100 µm, region F the optimum DEE is 170 µm, and region G the optimum DEE is 50 µm. For region E, the drop pattern is a 4 step, for F the drop pattern is a 4 step after removing one row of drops, for G the drop pattern is a 5 step after adding one row of drops as illustrated in FIG. 6L. The adjacent regions illustrated in FIGS. 6K-L are shown with only a few drops for illustration purposes, a typical region will have 10 s, 100 s, or even 1000 s of drops. The examples illustrated herein were done with a square grid of dispensable locations, but this is not necessary for practicing the invention. Other types of dispensable grids may be a diamond grid, staggered grid, interlaced grid, or a grid with slowly varying pitch. The example, illustrated herein is done relative to the imprint field edge that is orthogonal to the scanning direction, an individual skilled in the art would understand how to rotate the method so that the imprint field edge is parallel to the scanning direction by swapping appropriate variables (Δx, Δy). As such, each section will have a varying pitch and thus the overall linear density of the row adjacent to the edge is different than any other row within the imprint field. In one embodiment, the linear density of the row adjacent to the edge is different than an adjacent row. In one embodiment, the linear density of the row adjacent to the edge is different than a non-adjacent row. The steps described above can be repeated for an edge opposite the first edge. In one embodiment, the steps described above can be used to adjust the drop pattern along the top and bottom edges of the imprint field as seen along the X-direction. In one embodiment, the steps described above can be used to adjust the drop pattern along the top and bottom edges of the imprint field as seen along the Y-direction.

The method 400 can include placing a substrate 102 on the stage 106. In one embodiment, the substrate 102 can be a semiconductor wafer. The method can further include moving the substrate 102 and the set of the fluid dispense ports relative to each other, and dispensing fluid droplets of the formable material 124 onto the substrate 102 in the form of the adjusted fluid droplet pattern, at block 440. After the substrate 102 and the set of the fluid dispense ports start moving, the fluid droplets are dispensed onto the substrate 102 to achieve a physical instantiation of the adjusted fluid droplet pattern corresponding to the virtual instantiation of the adjusted fluid droplet pattern generated by the logic element. The fluid droplet pattern can be any of the patterns as previously described.

The method 400 can include contacting the formable material 124 with the template 108. Referring to FIG. 1, the patterning head 120, the stage 106, or both the patterning head 120 and the stage 106 vary a distance between the mold 20 and the substrate 102 to define a desired volume therebetween that is filled by the formable material 124. For example, the patterning head 120 can apply a force to the template 108, such that the mold 20 contacts the formable material 124 on the substrate 102. In an embodiment, the patterned surface has projections and recessions, and in another embodiment, the patterned surface can be a blank (a flat surface without any projections or recessions) and is used for planarization. The fluid droplet pattern allows the formable material to reach its desired locations more quickly along the edges of the imprint field without a significant risk of forming an extrusion defect. In an alternative embodiment, the mold 20 and the substrate 102 are substantially the same size and shape.

The method can include curing the formable material 124 to form a patterned layer corresponding to the pattern surface of the template 108. Curing can be performed by exposure to electromagnetic radiation. In an embodiment, the electromagnetic radiation can be ultraviolet radiation. In another embodiment, the formable material can be cured using heat. The patterned layer on the substrate 102 has a complementary pattern as compared to the patterned surface of the template 108. Projections along the patterned layer correspond to recessions in the patterned surface of the template 108, and recessions in the patterned layer correspond to projections along the patterned surface of the template 108. The recessions in the patterned layer are parts of a residual layer having a residual layer thickness. The methods can be useful in manufacturing an article that includes a substrate, such as an electronic component that includes part of a semiconductor wafer.

Many operations have been described with respect to particular components within the apparatus 100. In particular embodiment, operations performed by a logic element, which may be at least a part of the processor 140, may be performed by other components within the apparatus 100 or split between the processor 140 and such other components. For example, some operations previously described as being performed by the processor 140 may be performed by a stage controller that controls the operation of the stage 106, the fluid dispense system, a fluid dispenser controller that controls fluid dispenser 122. Furthermore, information can be transmitted in order to carry out the actions described herein. The information can be in the form of instructions to be executed, signals, pulses, or the like. The stage 106, the fluid dispense system, or both may include a controller that can act on instructions received from the processor 140. In another embodiment, the stage 106 or the fluid dispense system may respond to analog signals received. For example, the information can be a particular direct current voltage or a light pulse. After reading this specification, skilled artisans will be able to configure an imprint lithography apparatus 100 to meet the needs or desires in view of the equipment within the apparatus 100. Thus, the description of the embodiments does not limit the scope of the present invention.

Embodiments of the apparatuses and method can be useful in filling an imprint field relatively quickly without extrusion defects or other complications. A virtual fluid droplet pattern can be generated by a logic element, such as a processor within a lithographic tool, to tailor the linear density at an edge of an imprint field for a particular imprint surface of a template. Instructions corresponding to the virtual fluid droplet pattern can be provided to a fluid dispense system in forming an actual fluid droplet pattern. The fluid droplet pattern can allow a formable material to reach points along edges of an imprint closer in time as compared to conventional techniques. The adjusted linear density along the edge of the imprint field keeps the likelihood of forming an extrusion defect significantly low.

Note that not all of the activities described above in the general description, or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A method of generating a fluid drop pattern in imprint lithography, the method comprising:
    determining the fluid droplet pattern of fluid droplets of a formable material to be dispensed in one or more rows onto a substrate, wherein the fluid droplet pattern comprises a first row and a second row of an imprint field, wherein the first row is closer to an edge of the imprint field than the second row and wherein the first row is along the edge of the imprint field, wherein the first row has a first linear density determined by the amount of µm between droplets within the first row and the second row has a second linear density determined by the amount of µm between droplets within the second row, and wherein the first linear density is different from the second linear density; and
    dispensing fluid droplets of the formable material onto the substrate corresponding to the fluid droplet pattern.

2. The method of claim 1, further comprising a third row with a third linear density determined by the amount of µm between droplets within the third row, wherein the second row is closer to the edge than the third row, and wherein the second linear density is the same as the third linear density.

3. The method of claim 2, wherein the first row, the second row, and the third row are along the X-direction.

4. The method of claim 1, wherein the first row comprises one or more droplets, and wherein a first pitch between a first droplet of the one or more droplets and a second droplet of the one or more droplets is different from a second pitch between the second droplet of the one or more droplets and a third droplet of the one or more droplets.

5. The method of claim 4, wherein the second droplet is between the first droplet and the third droplet.

6. The method of claim 4, further comprising a fourth droplet, a fifth droplet, and a sixth droplet spaced apart from the first droplet, the second droplet, and the third droplet, wherein a third pitch between the fourth droplet and the fifth droplet is different from a fourth pitch between the fifth droplet and the sixth droplet.

7. The method of claim 6, wherein the fourth pitch is different from the second pitch.

8. The method of claim 1, wherein the first row comprises one or more droplets, and wherein each two droplets of the one or more droplets comprises a pitch, and wherein at least one pitch is different from every other pitch within the first row.

9. The method of claim 8, wherein at least two pitches are different from every other pitch within the first row.

10. The method of claim 9, wherein the DEE of the one or more droplets in the first row is the same.

11. The method of claim 1 further comprising:
determining an initial fluid droplet pattern of fluid droplets of a formable material to be dispensed in one or more rows, including the first row and the second row, onto a substrate;
adjusting the initial fluid droplet pattern to an intermediate fluid droplet pattern, wherein
adjusting the initial fluid droplet pattern comprises:
determining a mean optimum DEE; and
moving the fluid droplet pattern relative the imprint field by a distance corresponding to the mean optimum DEE;
adjusting the intermediate fluid droplet pattern to an adjusted fluid droplet pattern, wherein the adjusted fluid droplet pattern comprises the first linear density and the second linear density; and
dispensing fluid droplets of the formable material onto the substrate corresponding to the adjusted fluid droplet pattern.

12. A method of generating a fluid drop pattern in imprint lithography, the method comprising:
determining an initial fluid droplet pattern of fluid droplets of a formable material to be dispensed in one or more rows onto a substrate, wherein the fluid droplet pattern includes an imprint field, wherein the imprint field has an edge and a drop edge exclusion (DEE) along the edge;
adjusting the initial fluid droplet pattern to an intermediate fluid droplet pattern, wherein adjusting the initial fluid droplet pattern comprises:
determining a mean optimum DEE from two or more optimum DEEs; and
moving the fluid droplet pattern relative the imprint field by a distance corresponding to the mean optimum DEE;
adjusting the intermediate fluid droplet pattern to an adjusted fluid droplet pattern, wherein the adjusted fluid droplet pattern comprises a linear density of a row along the edge that is different from the linear density of a row away from the edge; and
dispensing fluid droplets of the formable material onto the substrate corresponding to the adjusted fluid droplet pattern.

13. The method of claim 12, wherein determining the two or more optimum DEEs comprises calculating a first optimum DEE for a first zone of one or more droplets and a second optimum DEE for a second zone of one or more droplets, wherein the two or more optimum DEEs is a shortest distance between a terminal fluid droplet and its adjacent edge of the imprint field.

14. The method of claim 13, wherein adjusting the intermediate fluid droplet pattern comprises:
determining a step configuration based on the mean optimum DEE and an optimum DEE for each zone.

15. The method of claim 12, wherein dispensing the fluid droplets of the formable material is performed during a single pass using a fluid dispenser having a series of nozzles that are aligned with the edge.

16. The method of claim 12, wherein the drop edge exclusion is defined by the edge of the imprint field and a line passing through centers of fluid droplets that is closest to the edge.

17. The method of claim 12, wherein the adjusted fluid droplet pattern minimizes extrusion defects and non-fill defects.

18. The method of claim 1, wherein the first row comprises three or more droplets, and wherein a distance along the first row between each two neighboring droplets of the three or more droplets comprises a pitch, and wherein at least one pitch in the first row is different from every other pitch within the first row.

19. The method of claim 18, wherein at least two pitches are different from every other pitch within the first row and wherein the DEE of the one or more droplets in the first row is the same.

20. A method of manufacturing an article using a method of generating a fluid drop pattern in imprint lithography, the method of manufacturing the article comprising:
determining an initial fluid droplet pattern of fluid droplets of a formable material to be dispensed in one or more rows onto a substrate, wherein the fluid droplet pattern includes an imprint field, wherein the imprint field has an edge and a drop edge exclusion (DEE) along the edge;
adjusting the initial fluid droplet pattern to an intermediate fluid droplet pattern, wherein adjusting the initial fluid droplet pattern comprises:
determining a mean optimum DEE from one or more optimum DEEs; and
moving the fluid droplet pattern relative the imprint field by a distance corresponding to the mean optimum DEE;
adjusting the intermediate fluid droplet pattern to an adjusted fluid droplet pattern, wherein the adjusted fluid droplet pattern comprises a linear density of a row along the edge that is different from the linear density of a row away from the edge;
dispensing fluid droplets of the formable material onto the substrate corresponding to the adjusted fluid droplet pattern;
contacting the dispensed formable material with a template;
solidifying the formable material under the template;
separating the template from the solidified formable material to form a film layer on the substrate; and
processing the substrate on which the film layer is produced to manufacture the article.

* * * * *